United States Patent
Watanabe et al.

(10) Patent No.: US 8,625,085 B2
(45) Date of Patent: Jan. 7, 2014

(54) DEFECT EVALUATION METHOD FOR SEMICONDUCTOR

(75) Inventors: Ryosuke Watanabe, Ebina (JP);
Masashi Tsubuku, Atsugi (JP);
Takayuki Inoue, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 128 days.

(21) Appl. No.: 13/407,943

(22) Filed: Feb. 29, 2012

(65) Prior Publication Data

US 2012/0229805 A1    Sep. 13, 2012

(30) Foreign Application Priority Data

Mar. 8, 2011    (JP) .................................. 2011-049786

(51) Int. Cl.
*G01N 21/00*    (2006.01)

(52) U.S. Cl.
USPC ......................................................... 356/73

(58) Field of Classification Search
USPC ......... 356/72–73, 326–330, 225; 324/750.23, 324/754.23, 93
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 5,923,182 A * | 7/1999 | Thakoor et al. | 324/754.23 |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced At Room Temperature,", Appl. Phys. Lett. (Applied Physics Letters), Sep. 27, 2004, vol. 85, No. 13, pp. 2541-2543.

(Continued)

*Primary Examiner* — Gregory J Toatley
*Assistant Examiner* — Dominic J Bologna
(74) *Attorney, Agent, or Firm* — Eric J. Robinson; Robinson Intellectual Property Law Office, P.C.

(57) ABSTRACT

Even in the case of a sample exhibiting low photoresponse, such as a wide bandgap semiconductor, a measurement method which enables highly accurate CPM measurement is provided. When CPM measurement is performed, photoexcited carriers which are generated by light irradiation of a sample exhibiting low photoresponse such as a wide bandgap semiconductor are instantly removed by application of positive bias voltage to a third electrode which is provided in the sample in addition to two electrodes used for measurement. When the photoexcited carriers are removed, even in the case of the sample exhibiting low photoresponse, the controllability of a photocurrent value is improved and CPM measurement can be performed accurately.

13 Claims, 8 Drawing Sheets

(56) References Cited

U.S. PATENT DOCUMENTS

| | | |
|---|---|---|
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0219327 A1* | 9/2010 | Arbore et al. ............... 250/206 |
| 2011/0227082 A1* | 9/2011 | Inoue et al. ................ 257/59 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-172731 A | 6/2005 |
| JP | 2006-165528 A | 6/2006 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—ZnO system at 1350° C,", Journal of Solid State Chemistry, Aug. 1, 1991, vol. 93, No. 2, pp. 298-315.

Kimizuka.N. et al., "Syntheses and Single-Crystal Data of Homologous Compounds, $In_2O_3(ZnO)m$ (m=3, 4, and 5), $InGaO_3(ZnO)_3$, and $Ga_2O_3(ZnO)m$ (m=7, 8, 9, and 16) in the $In_2O_3$—$ZnGa_2O_4$—ZnO System,", Journal of Solid State Chemistry, Apr. 1, 1995, vol. 116, No. 1, pp. 170-178.

(56) References Cited

OTHER PUBLICATIONS

Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.
Asakuma.N. et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.
Osada.T et al., "15.2: Development of Driver-Integrated Panel using Amorphous In—Ga—Zn—Oxide TFT,", SID Digest '09 : SID Internatonal Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.
Tsuda.K et al., "Ultra Low Power Consumption Technologies for Mobile TFT-LCDs ,", IDW '02 : Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits , 2008, vol. 43, No. 1, pp. 292-299.
Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane.", SID Digest '09 : SID International Symposium Digest of Technical Papers, May 31, 2009, pp. 280-283.
Lee.M et al., "15.4:Excellent Performance of Indium—Oxide—Based Thin-Film Transistors by DC Sputtering,", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and it's Bending Properties, ", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn—Oxide TFTS,", IDW '09 : Proceedings of the 16th International Display Workshops, 2009, pp. 689-692.
Park.J et al., "Amorphous Indium—Gallium—Zinc Oxide TFTS and Their Application for Large Size AMOLED,", AM-FPD '08 Digest of Technical Papers, Jul. 2, 2008, pp. 275-278.
Park.S et al., "Challenge to Future Displays: Transparent AM-OLED Driven by Peald Grown ZnO TFT,", IMID '07 Digest, 2007, pp. 1249-1252.
Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.
Osada.T et al., "Development of Driver-Integrated Panel Using Amorphous In—Ga—Zn—Oxide TFT,", AM-FPD '09 Digest of Technical Papers, Jul. 1, 2009, pp. 33-36.
Hirao.T at al., "Novel Top-Gate Zinc Oxide Thin-Film Transistors (ZnO TFTS) for AMLCDS,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.
Ohara.H et al., "21.3:4.0 in. QVGA AMOLED Display Using In—Ga—Zn—Oxide TFTS With a Novel Passivation Layer,", SID Digest '09 : SID International Symposium Digest of Technical Papers, May 31, 2009, pp. 284-287.
Miyasaka.M, "SUFTLA Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.
Lee.H et al., "Current Status of, Challenges to, and Perspective View of AM-OLED ,", IDW '06 : Proceedings of the 13th International Display Workshops, Dec. 7, 200, pp. 663-666.
Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.
Nakamura.M, "Synthesis of Homologous Compound with New Long-Period Structure,", NIRIM Newsletter, Mar. 1, 1995, vol. 150, pp. 1-4.
Kikuchi.H et al., "Polymer-Stabilized Liquid Crystal Blue Phases,", Nature Materials, Sep. 2, 2002, vol. 1, pp. 64-68.
Kimizuka.N. et al., "Spinel,YBFE2O4, and YB2FE3O7 Types of Structures for Compounds in the IN2O3 and SC2O3-A2O3-BO Sys-

(56) References Cited

OTHER PUBLICATIONS tems [A; Fe, Ga, or Al; B: Mg, Mn, Fe, Ni, Cu,or Zn] at Temperatures over 1000° C,", Journal of Solid State Chemistry, 1985, vol. 60, pp. 382-384.
Kitzerow.H et al., "Observation of Blue Phases in Chiral Networks,", Liquid Crystals, 1993, vol. 14, No. 3, pp. 911-916.
Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.
Meiboom.S et al., "Theory of the Blue Phase of Cholesteric Liquid Crystals,", Phys. Rev.Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AMOLED Display,", SID Digest '08 : SID International Symposium Digest of Technical Papers, May 20, 2008, vol. 39, pp. 629-632.
Orita.M et al., "Mechanism of Electrical Conductivity of Transparent InGaZnO4,", Phys.Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.
Janotti.A et al., "Native Point Defects in ZnO,", Phys. Rev. B (Physical Review. B), Oct. 4, 2007, vol. 76, No. 16, pp. 165202-1-165202-22.
Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.
Janotti.A et al., "Oxygen Vacancies in ZnO,", Appl. Phys. Lett. (Applied Physics Letters) , 2005, vol. 87, pp. 122102-1-122102-3.
Oba.F et al., "Defect energetics in ZnO: A hybrid Hartree-Fock density functional study,", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor,", Philosophical Magazine, 2001, vol. 81, No. 5, pp. 501-515.
Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.
Mo. Y et al., "Amorphous Oxide TFT Backplanes for Large Size AMOLED Displays,", IDW '08 : Proceedings of the 6th International Display Workshops, Dec. 3, 2008, pp. 581-584.
Kim.S et al., "High-Performance oxide thin film transistors passivated by various gas plasmas,", 214th ECS Meeting, 2008, No. 2317, ECS.
Clark.S et al., "First Principles Methods Using CASTEP,", Zeitschrift fur Kristallographie, 2005, vol. 220, pp. 567-570.
Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.
Park.J et al., "Dry etching of ZnO films and plasma-induced damage to optical properties,", J. Vac. Sci. Technol. B (Journal of Vacuum Science & Technology B), Mar. 1, 2003, vol. 21, No. 3, pp. 800-803.
Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, H1009-H1014.
Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.
Barquinha et al., "Effect of UV and visible light radiation on the electrical performances of transparent TFTs based on amorphous indium zinc oxide," J. Non-Cryst. Solids (Journal of Non-Crystalline Solids), Apr. 18, 2006, vol. 352, No. 9-20, pp. 1756-1760.
Lee.K et al., "The effect of moisture on the photon-enhanced negative bias thermal instability in Ga—In—Zn—O thin film transistors," Appl. Phys. Lett. (Applied Physics Letters), Dec. 8, 2009, vol. 95, No. 23, pp. 232106-1-232106-3.
Vanecek et al. "Direct Measurement of the Gap States and Band Tail Absorption by Constant Photocurrent Method in Amorphous Silicon", Solid State Communications, 1981, vol. 39, pp. 1199-1202.
Smith et al. "Thermal-Equilibrium Defect Processes in Hydrogenated Amorphous Silicon," Physical Review Letters, Nov. 10, 1986, vol. 57, No. 19, pp. 2450-2453.
Marshall et al. "Evaluation of the Constant Photocurrent Method for Determining the Energy Distribution of Localised States in Disordered Semiconductors,", Journal of Non-Crystalline Solids, 1991, vol. 137, pp. 343-346.
Lee et al., "Steady-state photoconductivity of amorphous In—Ga—Zn—O," Thin Solid Films, 2009, vol. 518, No. 11, pp. 3000-3003.

* cited by examiner

DEFECT EVALUATION METHOD FOR SEMICONDUCTOR

BACKGROUND OF THE INVENTION

1. Field of the Invention

The present invention relates to a defect evaluation method for a wide bandgap semiconductor using a CPM measurement apparatus.

2. Description of the Related Art

Although transistors formed using amorphous silicon had been used for conventional display devices typified by liquid crystal televisions, an oxide semiconductor has attracted attention as a material which replaces a silicon semiconductor in order to form transistors. For example, an active matrix display device in which an amorphous oxide including indium (In), gallium (Ga), and zinc (Zn) is used for an active layer of a transistor and the electron carrier concentration of the amorphous oxide is lower than $1 \times 10^{18}$ cm$^{-3}$ is disclosed (see Patent Document 1).

However, some problems of a transistor using an oxide semiconductor have been pointed out. One of them is instability of characteristics, and it is pointed out that the threshold voltage is changed by irradiation with visible light and ultraviolet light (see Non-Patent Document 1). Further, in terms of reliability of a transistor, a problem in that characteristics are changed by a bias-temperature stress test has been pointed out (see Non-Patent Document 2).

REFERENCE

Patent Document

[Patent Document 1] Japanese Published Patent Application No. 2006-165528

Non-Patent Documents

[Non-Patent Document 1] P. Barquinha, A. Pimentel, A. Marques, L. Pereira, R. Martins, and E. Fortunato, "Effect of UV and visible light radiation on the electrical performances of transparent TFTs based on amorphous indium zinc oxide", *Journal of Non-Crystalline Solids* 352, (2006) 1756-1760

[Non-Patent Document 2] Kwang-Hee Lee, Ji Sim Jung, Kyoung Seok Son, Joon Seok Park, Tae Sang Kim, Rino Choi, Jae Kyeong Jeong, Jang-Yeon Kwon, Bonwon Koo, and Sangyun Lee, "The effect of moisture on the photon-enhanced negative bias thermal instability in Ga—In—Zn—O thin film transistors", *APPLIED PHYSICS LETTERS* 95, (2009) 232106

SUMMARY OF THE INVENTION

As one of evaluation methods for a semiconductor, a constant photocurrent method (CPM) is known.

CPM measurement is carried out in such a manner that the amount of light with which a surface of a sample between terminals is irradiated is adjusted in the state where voltage is applied between two electrodes included in the sample so that a photocurrent value is kept constant, and an absorption coefficient is derived from the amount of the irradiation light in each wavelength. In the CPM measurement, when the sample has a defect, the absorption coefficient of energy which corresponds to a level at which the defect exists (calculated from a wavelength) is increased. The increase in the absorption coefficient is multiplied by a constant, whereby the defect density of the sample can be obtained.

In order to obtain stable photocurrent, a sequence in which measurement is continuously repeated until photocurrent become constant in each wavelength is used in the CPM measurement. However, depending on a measurement object, in some cases, it takes a very long time until constant photocurrent is obtained. In addition, when measurement time is shortened, the accuracy of the measurement is reduced in some cases.

An oxide semiconductor has a bandgap of approximately 3 eV and is one of wide bandgap semiconductors. Although an oxide semiconductor has a light-transmitting property in a visible light region, it is pointed out that when a transistor including an oxide semiconductor is irradiated with light having energy which is close to or equal to the bandgap of the oxide semiconductor or greater than the bandgap, the threshold voltage of the transistor is changed by 10 V.

The change in characteristics of the transistor including an oxide semiconductor due to light irradiation is caused by low photoresponse of the oxide semiconductor. "Low photoresponse" means that it takes a very long time until carriers which are generated by irradiation of the oxide semiconductor with light (photoexcited carriers) are recombined and disappear. It is known that wide bandgap semiconductors generally exhibit low photoresponse to some extent.

As described above, the low photoresponse of the wide bandgap semiconductor causes difficulty in CPM measurement. In other words, photocurrent continues to flow even in the state where light irradiation is stopped, and thus it is difficult to make the photocurrent value constant in the CPM measurement for the wide bandgap semiconductor. As a result, accurate CPM measurement cannot be performed on the wide bandgap semiconductor.

Thus, one embodiment of the present invention is to enable highly accurate measurement of defect density by CPM measurement even in the case of a wide bandgap semiconductor exhibiting low photoresponse.

In a measurement method using CPM according to one embodiment of the present invention, when CPM measurement is performed, photoexcited carriers which are generated by light irradiation of a sample exhibiting low photoresponse are instantly reduced by application of positive bias voltage to a third electrode which is provided in the sample in addition to two electrodes used for measurement.

The photoexcited carriers are reduced by the application of the positive bias voltage to the third electrode, whereby the photocurrent value is easily made constant. Therefore, accurate CPM measurement can be performed even on the sample exhibiting low photoresponse.

In general, the CPM measurement includes mechanism in which light irradiation and light blocking are switched at a predetermined frequency in order to reduce influence of the generated photoexcited carriers. In short, the photoexcited carriers which are generated at the time of light irradiation are reduced when light is blocked. However, when this mechanism is applied to a sample exhibiting low photoresponse, such as a wide bandgap semiconductor, it takes several seconds to several hours until the photoexcited carriers are reduced, thereby incredibly lengthening the measurement time.

Therefore, the positive bias voltage is applied concurrently with performing light blocking to reduce the influence of photoresponse, and then the CPM measurement is performed, whereby a time for which light is blocked can be shortened and high-speed and highly accurate CPM measurement can be performed.

For this, the third electrode for the application of the bias voltage is provided in the sample.

In addition, the CPM measurement apparatus, which generally includes two terminals, includes a power source and a third terminal for application of the bias voltage to the third electrode.

Even in the case of a wide bandgap semiconductor exhibiting low photoresponse, a measurement method which enables high-speed and highly accurate CPM measurement is provided.

DETAILED DESCRIPTION OF THE INVENTION

Figure 1:
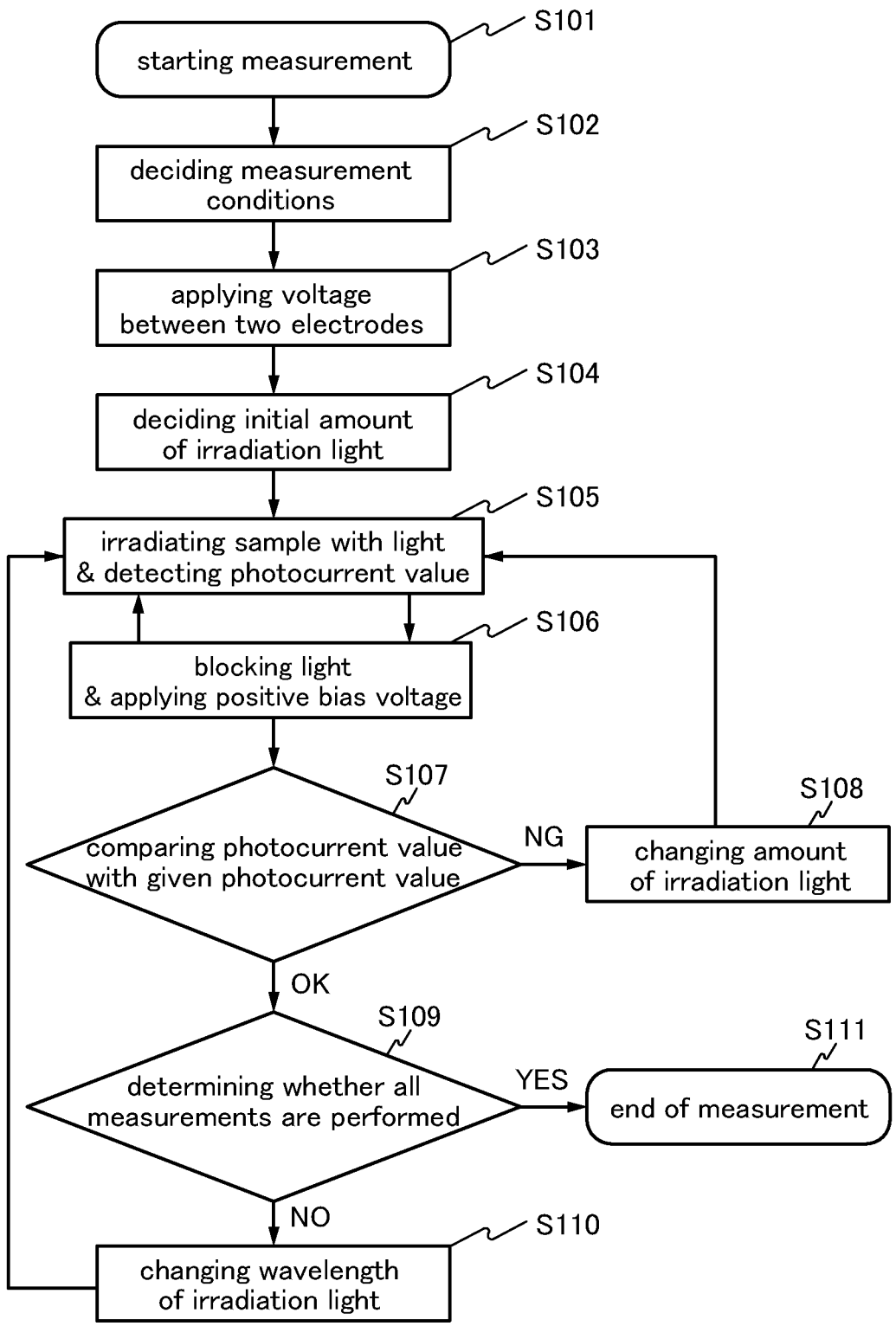
FIG. 1 is a flowchart showing a measurement method using CPM according to one embodiment of the present invention.

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments. In describing structures of the present invention with reference to the drawings, the same reference numerals are used in common for the same portions in different drawings. Note that the same hatch pattern is applied to similar parts, and the similar parts are not especially denoted by reference numerals in some cases.

Voltage refers to a potential difference between given potential and reference potential (e.g., ground potential) in many cases. Note that voltage can also be referred to as potential.

Even when it is written in this specification that "to be connected", there is a case in which no physical connection is made in an actual circuit and a wiring is only extended.

Note that the ordinal numbers such as "first" and "second" in this specification are used for convenience and do not denote the order of steps or the stacking order of layers. In addition, the ordinal numbers in this specification do not denote particular names which specify the present invention.

(Embodiment 1)

In this embodiment, a measurement method using CPM which is one embodiment of the present invention will be described with reference to FIG. 1.

FIG. 1 is a flowchart showing the process of the measurement method using CPM. Measurement starts in a step S101, and measurement conditions (a wavelength range, the frequency of a chopper, and a constant current value) are appropriately decided in a step S102. The wavelength range and the constant current value may be selected as appropriate depending on a sample. The wavelength range is decided by the bandgap of the sample, and the like. For example, when the sample has a bandgap greater than or equal to 2.5 eV and less than or equal to 4.0 eV, the wavelength may be set to longer than or equal to 300 nm and shorter than or equal to 1200 nm. The frequency of the chopper is set in accordance with a switching speed of light irradiation and light blocking. The frequency of the chopper may be selected in accordance with the photoresponsiveness of the sample. The frequency of the chopper is set to low when the sample exhibits low photoresponse, and is set to high when the sample exhibits high photoresponse. The use of one embodiment of the present invention makes it possible to reduce photoexcited carriers by application of positive bias voltage even when the sample exhibits low photoresponse. Therefore, the frequency of the chopper can be set to high. Accordingly, it is possible to perform high-speed and highly accurate CPM measurement even in the case of using the sample exhibiting low photoresponse. The constant current value is decided in advance by preliminary measurement.

A method for deciding the constant current value is concretely described. First, some wavelengths are freely selected from the wavelength range which is to be subjected to measurement. It is preferable that the given wavelengths are selected as evenly as possible from the wavelength range which is to be subjected to measurement. Next, voltage is applied between two electrodes of the sample, and a photocurrent value is measured in each of the wavelengths which are selected in the vicinity of the maximum amount of light of the apparatus. A current value which is smaller than the minimum value of the obtained photocurrent values by approximately 5% to 30% is set as the constant current value.

In a step S103, voltage is applied between the two electrodes of the sample. The voltage is, for example, larger than or equal to 0.1 V and smaller than or equal to 50 V.

Then, in a step S104, the initial amount of irradiation light is decided. The original amount of the irradiation light may be the maximum amount of light of the apparatus, for example.

Next, a step S105 and a step S106 are repeated. In the step S105, the sample is irradiated with light to detect the photocurrent value. In the step S106, light is blocked, and positive bias voltage is applied to an electrode which is different from the two electrodes is provided at the sample so that an insulating film is sandwiched therebetween. The light irradiation and the light blocking in the steps S105 and S106 are periodically repeated in accordance with the frequency of the chopper. At the time of blocking light, the bias voltage is applied to the third electrode of the sample for a time in the range of 1 μsec to 1 sec, preferably 100 μsec to 100 msec. At this time, the bias voltage may be greater than or equal to 1 V and less than or equal to 30 V. The application of the positive bias voltage makes it possible to reduce the photoexcited carriers in the sample and improve the accuracy of detecting photocurrent.

Then, in a step S107, it is determined whether the photocurrent value which is detected in the step S105 is within a certain range (e.g., within the range of ±10%) of the given photocurrent value which is decided in the step S102. When the photocurrent value which is detected is out of the certain range (e.g., out of the range of ±10%) of the given photocurrent value, the amount of irradiation light is changed in a step S108. Note that when the range of the photocurrent value with which determination is performed in the step S107 is narrowed, the accuracy of the CPM measurement is increased;

when the range of the photocurrent value with which determination is performed in the step S107 is expanded, the accuracy of the CPM measurement is reduced. However, as the range of the photocurrent value with which determination is performed in the step S107 becomes narrower, it takes longer time to control the photocurrent value and a longer time is needed for the CPM measurement. Here, by applying one embodiment of the present invention, influence of photoresponsiveness is reduced and the photocurrent value is speedily controlled. Thus, even when the range of the photocurrent value with which determination is performed in the step S107 is a narrow range (e.g., the range of ±5%, or ±2%) of the given photocurrent value, the time needed for the CPM measurement can be shortened. In short, the CPM measurement can be performed speedily and accurately.

When the amount of the irradiation light is changed, a neutral density (ND) filter, a wedge filter, and/or the like may be used.

In the case where the amount of the irradiation light is changed in the step S108, the process returns to the step S105 to detect the photocurrent value. A step S105 and a step S106 are repeated again. In the step S107, it is determined whether the photocurrent value which is detected is within the certain range (within the range of ±10%) of the given photocurrent value which is decided in the step S102. When the photocurrent value which is detected is out of the certain range (out of the range of ±10%) of the given photocurrent value, the amount of irradiation light is changed in the step S108. These steps are repeated so that the photocurrent value which is detected is within the certain range (with in the range of ±10%) of the given photocurrent value which is decided in the step S102.

When it is determined that the photocurrent value which is detected in the step S107 is within the certain range (within the range of ±10%) of the given photocurrent value which is decided in the step S102, the amount of the irradiation light and the wavelength of the irradiation light are recorded, the process moves to a step S109, and it is determined whether measurement is performed on all of the given wavelengths. When it is determined that the measurement is not performed on all of the given wavelengths, the wavelength of the irradiation light is changed in a step S110, and the process returns to the step S105.

When these steps are repeated and then it is determined that measurement is performed on all of the wavelengths in the step S109, the process moves to a step S111, so that the CPM measurement is completed.

This is an example of the measurement method using CPM.

The measurement method using CPM according to one embodiment of the present invention enables high-speed and highly accurate CPM measurement even in the case of a wide bandgap semiconductor exhibiting low photoresponse.

This embodiment can be combined with the other embodiment as appropriate.

(Embodiment 2)

In this embodiment, the structure of a CPM measurement apparatus according to one embodiment of the present invention and the structure of a sample will be described with reference to FIG. 2 and FIGS. 3A to 3C.

Figure 2:
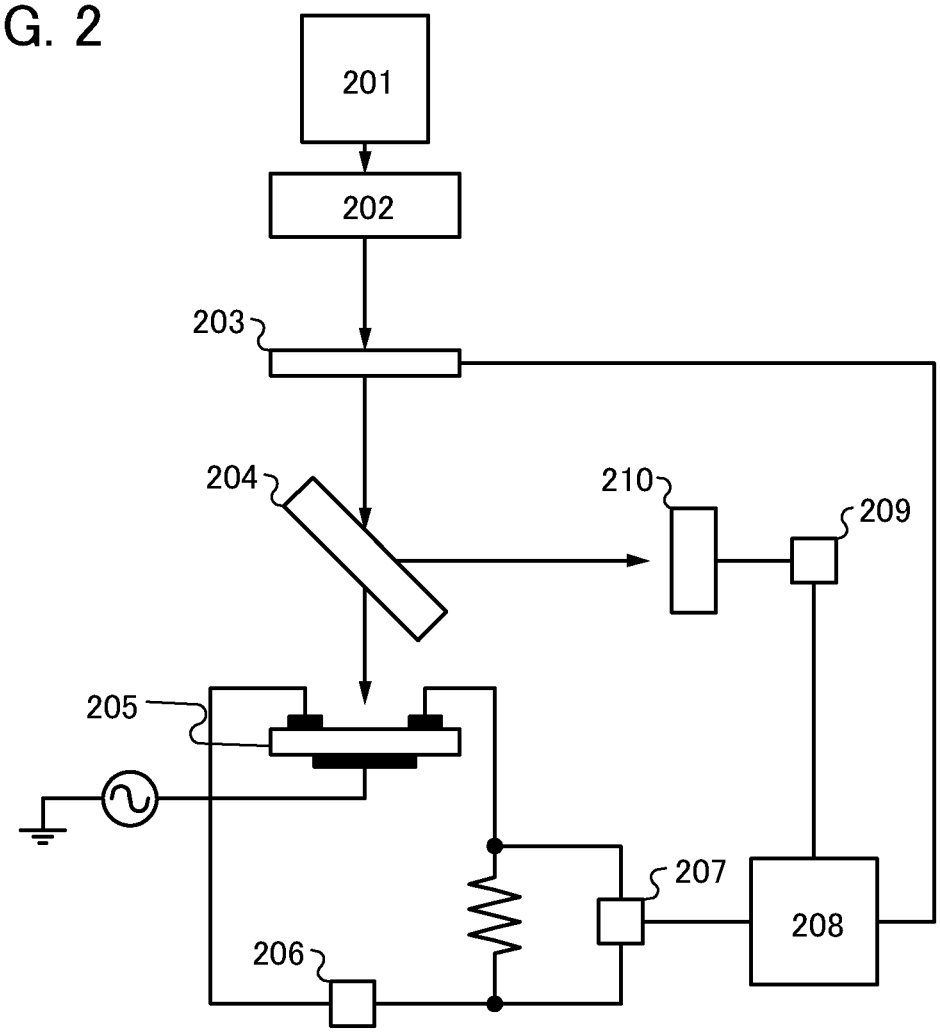
FIG. 2 is a schematic view illustrating a CPM measurement apparatus according to one embodiment of the present invention.

FIG. 2 is a schematic view of a CPM measurement apparatus. For simplicity, light paths are denoted by arrows and wirings and the like are denoted by solid lines. Light emitted from a lamp 201 enters a sample 205 through a monochromator 202, a filter 203, and a beam splitter 204. Note that the filter 203 may be omitted or a plurality of filters 203 may be provided. The beam splitter 204 transmits and reflects the light, and then makes the transmitted light and the reflection light enter the sample 205 and a photodiode 210, respectively. However, the transmitted light and the reflection light do not necessarily enter the sample 205 and the photodiode 210, respectively, and the transmitted light and the reflection light may enter the photodiode 210 and the sample 205, respectively.

As the lamp 201, a xenon lamp, a mercury lamp, a halogen lamp, or the like may be used, for example. Alternatively, a combination of these lamps may be used as the lamp 201. A xenon lamp is preferably used.

Any spectroscope may be used for the monochromator 202 as long as it can extract light in a narrow wavelength range from light in a broad wavelength range.

As the filter 203, an ND filter and/or a wedge filter may be used. Alternatively, plural kinds of ND filters and/or plural kinds of wedge filters may be prepared. In this manner, the controllability of the amount of the irradiation light can be improved.

The light which enters the photodiode 210 is converted into current. After that, a value of the current is measured by a lock-in amplifier 209, and the amount of the irradiation light can be estimated by a calculator 208.

The sample 205 includes a first electrode, a second electrode, and a third electrode. The first electrode and the second electrode are connected to a direct-current power source 206. Note that a resistor is provided between the direct-current power source 206 and at least one of the first electrode and the second electrode. A lock-in amplifier 207 is provided in parallel to the resistor and can measure a photocurrent value. The measured photocurrent value is fed back to the filter 203 via the calculator 208. When the photocurrent value is too high, the transmittance of the filter 203 is reduced to reduce the amount of the irradiation light. When the photocurrent value is too low, the transmittance of the filter 203 is increased to increase the amount of the irradiation light.

Note that the lock-in amplifier 207 and the lock-in amplifier 209 each have a function of sensitively extracting signals corresponding signals at the time of light irradiation from the input signals and outputting them.

The third electrode included in the sample 205 is connected to, for example, a high frequency power source. The high frequency power source applies positive bias voltage at a certain timing, whereby photoexcited carriers in the sample can be reduced.

Figure 3A:
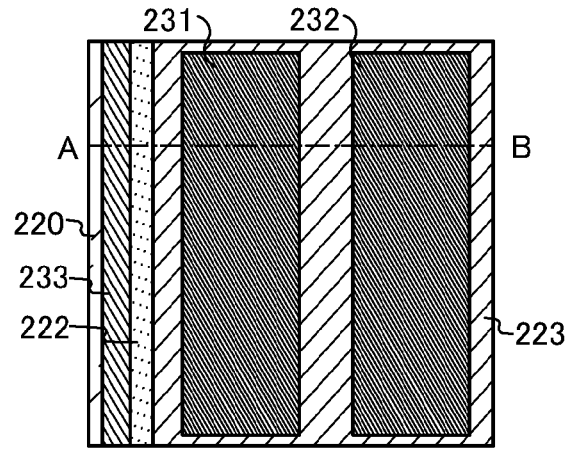
FIGS. 3A to 3C are top views and a cross-sectional view of a sample for CPM measurement according to one embodiment of the present invention.

FIG. 3A illustrates a top view of the sample 205. In addition, FIG. 3B illustrates a cross section A-B which corresponds to an alternate long and short dashed line A-B of FIG. 3A.

The sample 205 includes a supporting member 220, a third electrode 233 over the supporting member 220, an insulating film 222 over the third electrode 233, a wide bandgap semiconductor film 223 over the insulating film 222, and a first electrode 231 and a second electrode 232 which are one pair provided over the wide bandgap semiconductor film 223.

Figure 3B:
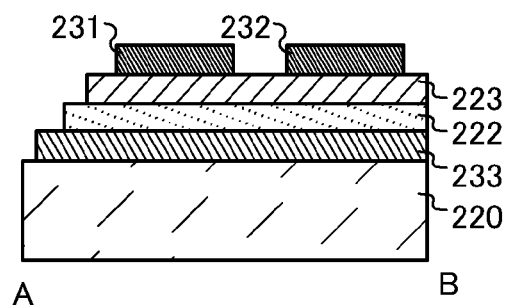
Figure 3C:
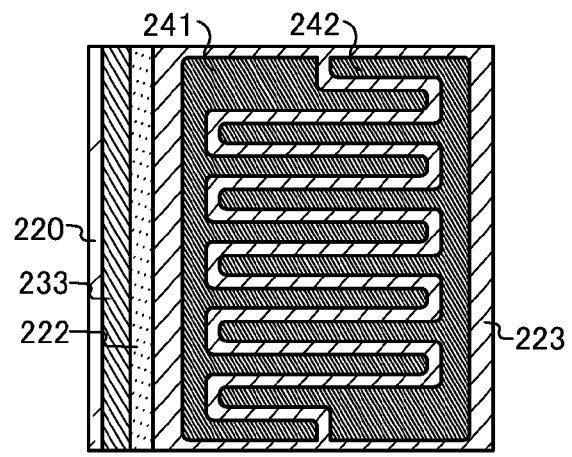

Side edges of the supporting member 220, the third electrode 233, the insulating film 222, and the wide bandgap semiconductor film 223 are not aligned in FIGS. 3A to 3C but may be substantially aligned with each other.

Although there is no particular limitation on the supporting member 220, a glass substrate, a ceramic substrate, a quartz substrate, a sapphire substrate, or the like may be used. Alternatively, a single crystal semiconductor substrate or a polycrystalline semiconductor substrate of silicon, silicon carbide, or the like, a compound semiconductor substrate of silicon germanium or the like, an SOI (silicon on insulator) substrate, or the like can be used.

Note that the supporting member 220 is necessary when the wide bandgap semiconductor film 223 is a thin film. However, when the wide bandgap semiconductor film 223 is strong enough to support other components, the supporting member 220 is not necessary.

A conductive material such as a metal plate is preferably used for the supporting member 220. When the supporting member 220 is formed using a conductive material, the supporting member 220 can also has a function as the third electrode 233. Further, when the supporting member 220 is formed using a conductive material, for example, it is possible that bias voltage is applied through a sample holder of the CPM measurement apparatus, which makes it easy to perform measurement and manufacturing of the sample.

The first electrode 231 and the second electrode 232 may be each formed with a single layer or a stack of layers using one or more of Al, Ti, Cr, Co, Ni, Cu, Y, Zr, Mo, Ag, Ta, W, Pt, Au, a nitride of these elements, an oxide of these elements, and an alloy of these elements. Alternatively, a transparent conductive film containing plural kinds of materials selected from Si, Ti, Ni, Cu, Zn, Ga, In, and Sn may be used. Preferably, a material which does not form an insulating film at an interface with the wide bandgap semiconductor film 223 is selected.

It is preferable that the first electrode 231 and the second electrode 232 are formed in the same layer with the use of the same material because the manufacturing of the sample is simplified.

Note that the first electrode 231 and the second electrode 232 are each a rectangle in FIG. 3A but are not limited to this shape. For example, a comb-like shape may be employed as in the case of a first electrode 241 and a second electrode 242 illustrated in FIG. 3C. Such a shape makes it possible to keep a distant between the electrodes constant and expand the width of each of the electrodes. When the width of each of the electrodes is expanded, the photocurrent value can be increased without changing the size of the sample and detection sensitivity can be increased. In addition, the shapes of the first electrode and the second electrode can be modified as appropriate.

The third electrode 233 may be formed using the same material as the first electrode 231 and the second electrode 232.

Any material can be used for the insulating film 222 as long as it has an insulating property. For example, the insulating film 222 may be formed with a stack of layers or a single layer using one or more of silicon oxide, silicon oxynitride, silicon nitride oxide, silicon nitride, aluminum oxide, hafnium oxide, yttrium oxide, zirconium oxide, and the like.

A material to be subjected to CPM measurement, such as an oxide semiconductor (an In—Ga—Zn—O-based material or the like), an organic compound, a silicon-based compound (silicon carbide or the like), or a carbon-based compound (diamond or the like) is used as the wide bandgap semiconductor film 223.

This embodiment relates to the CPM measurement apparatus which enables the measurement method using CPM described in Embodiment 1, and the method for manufacturing a sample. The use of the CPM measurement apparatus and/or the sample described in this embodiment make/makes it possible to perform high-speed and highly accurate CPM measurement even in the case of a wide bandgap semiconductor exhibiting low photoresponse.

This embodiment can be combined with the other embodiment as appropriate.

EXAMPLE 1

In this example, an example of photoresponse of an oxide semiconductor which is a wide bandgap semiconductor will be described with reference to FIGS. 4A and 4B, FIGS. 5A and 5B, FIGS. 6A and 6B, FIGS. 7A and 7B, and FIGS. 8A and 8B.

Figure 4A:
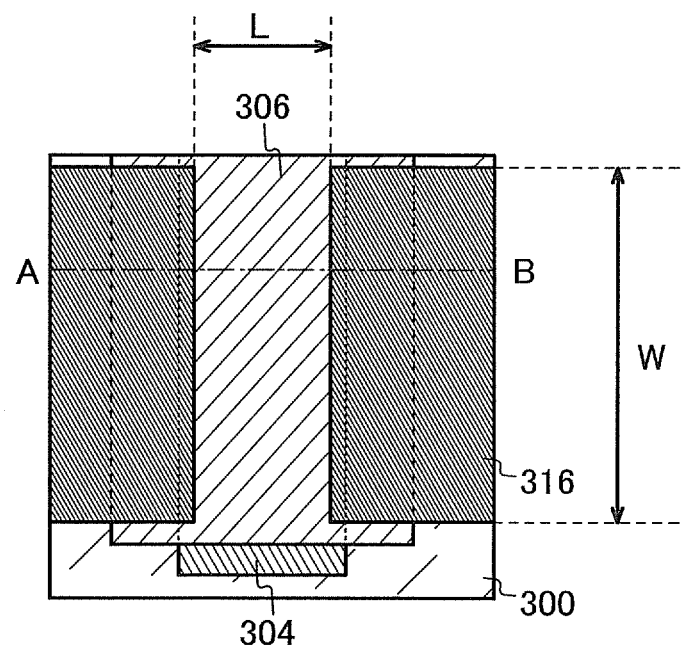
FIGS. 4A and 4B are a top view and a cross-sectional view of a sample for CPM measurement according to one embodiment of the present invention.
Figure 4B:
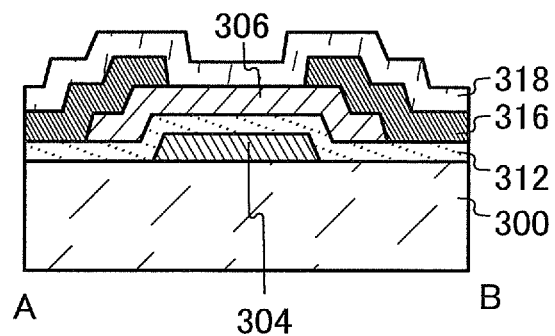

FIGS. 4A and 4B illustrate a top-surface shape and a cross-sectional shape of a sample subjected to measurement, respectively. FIG. 4B illustrates a cross section A-B which corresponds to an alternate long and short dashed line A-B in the top view in FIG. 4A.

The sample includes an electrode 304 over a substrate 300, an insulating film 312 covering the electrode 304, an oxide semiconductor film 306 which overlaps with the electrode 304 with the insulating film 312 provided therebetween, a pair of electrodes 316 in contact with the oxide semiconductor film 306, and an insulating film 318 over the oxide semiconductor film 306.

In FIG. 4A, a distance L between the pair of electrodes is 30 μm and the width W of the electrode is 10000 μm.

Glass was used for the substrate 300, a tungsten film was used for the electrode 304, a titanium film was used for the pair of electrodes 316, and a silicon oxide film was used for the insulating film 312 and the insulating film 318.

Here, the oxide semiconductor film 306 was formed to a thickness of 50 nm by a sputtering method, using an In—Ga—Zn—O (the atomic ratio of In:Ga:Zn is 1:1:2) target.

A method for measuring photoresponse is described below.

A voltage of 0.1 V was applied between the pair of electrodes 316, and the electrode 304 was set at 0 V.

Figure 5A:
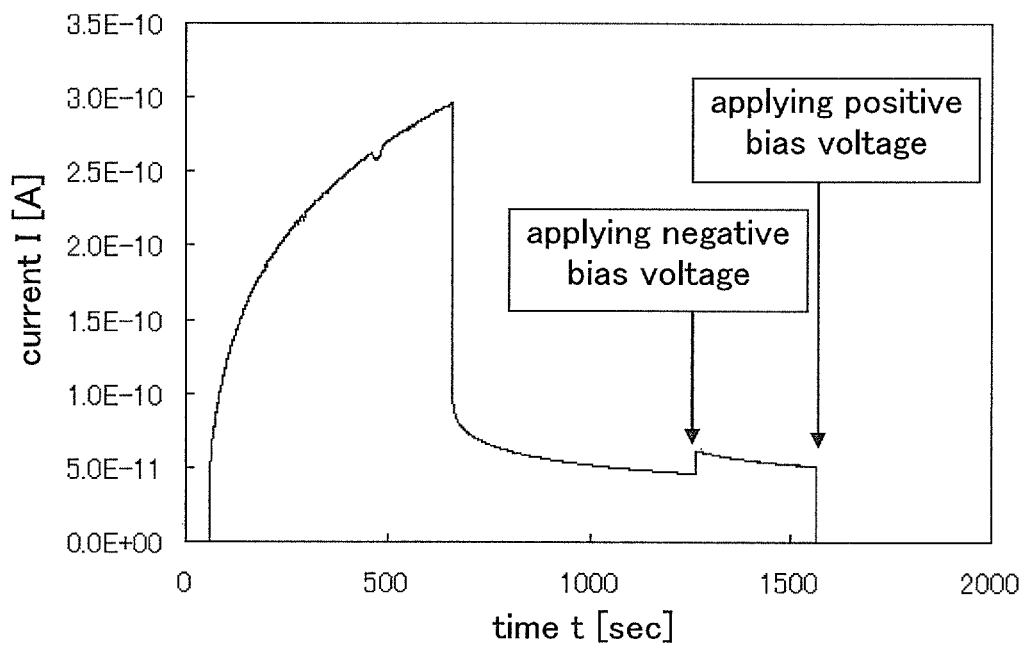
FIGS. 5A and 5B are each a graph showing photoresponse of an oxide semiconductor film.
Figure 5B:
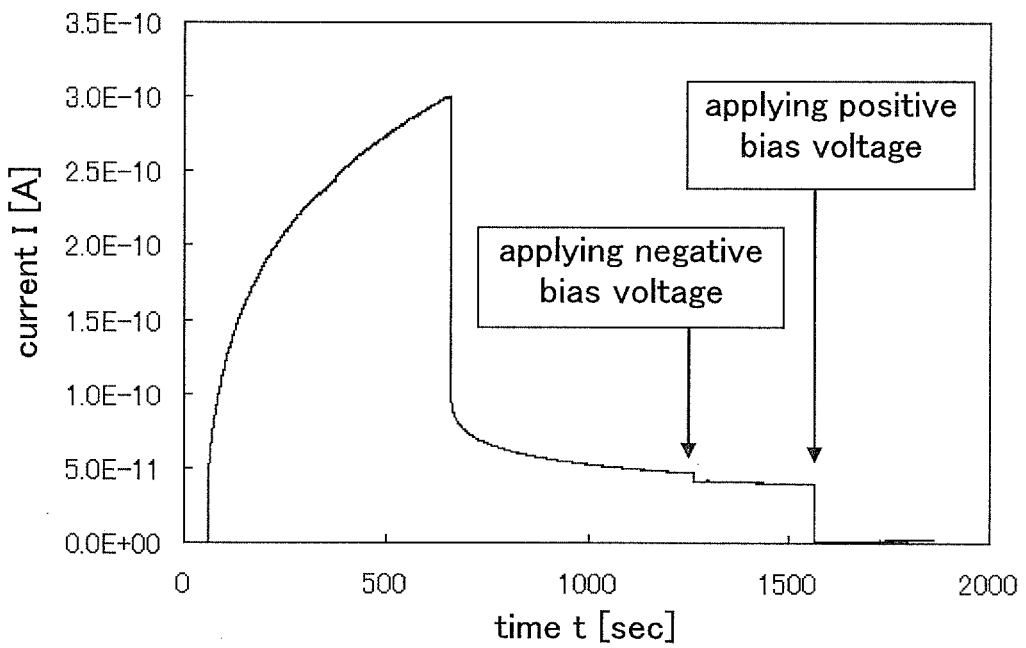
Figure 6A:
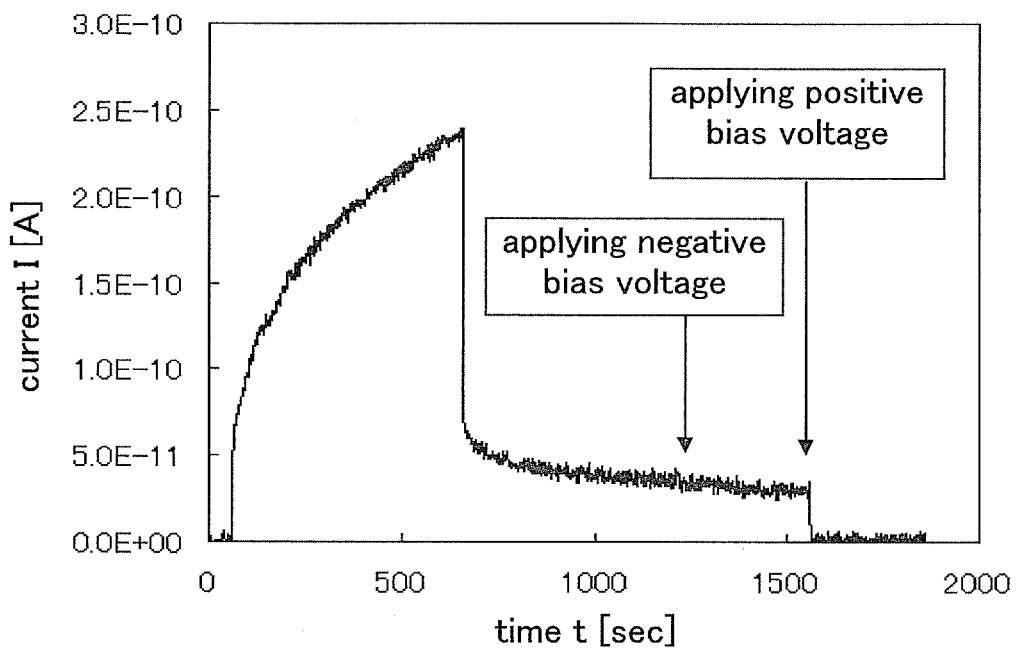
FIGS. 6A and 6B are each a graph showing photoresponse of an oxide semiconductor film.
Figure 6B:
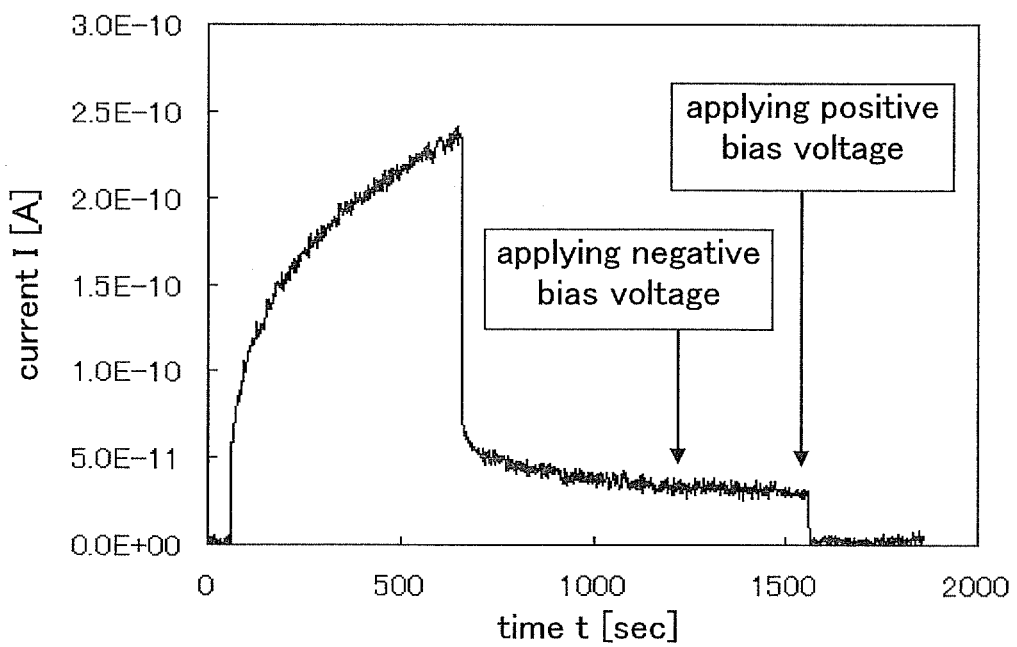
Figure 7A:
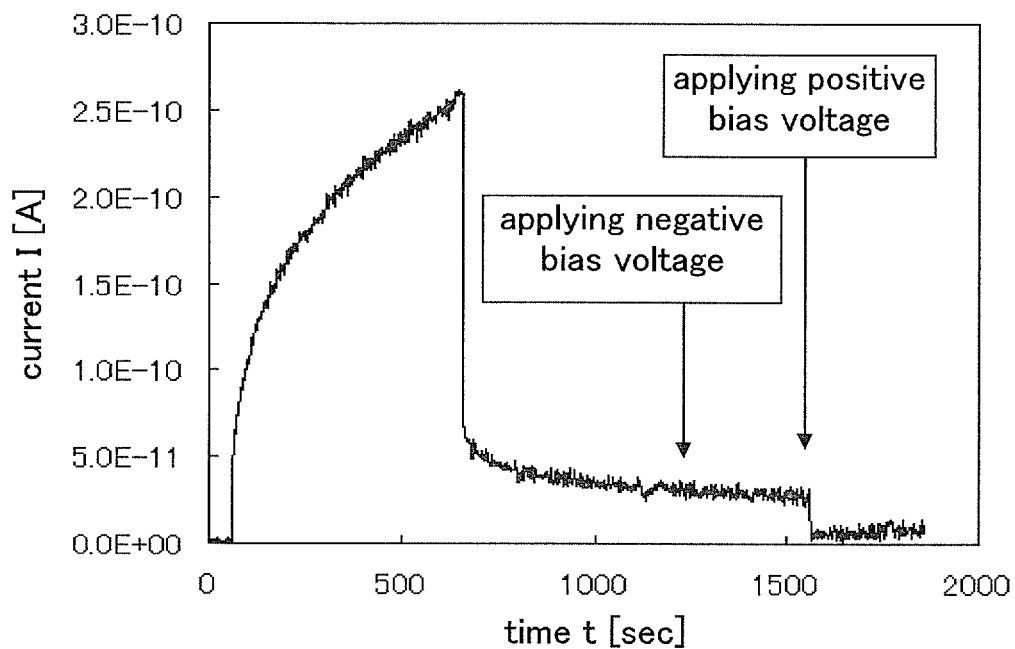
FIGS. 7A and 7B are each a graph showing photoresponse of an oxide semiconductor film.
Figure 7B:
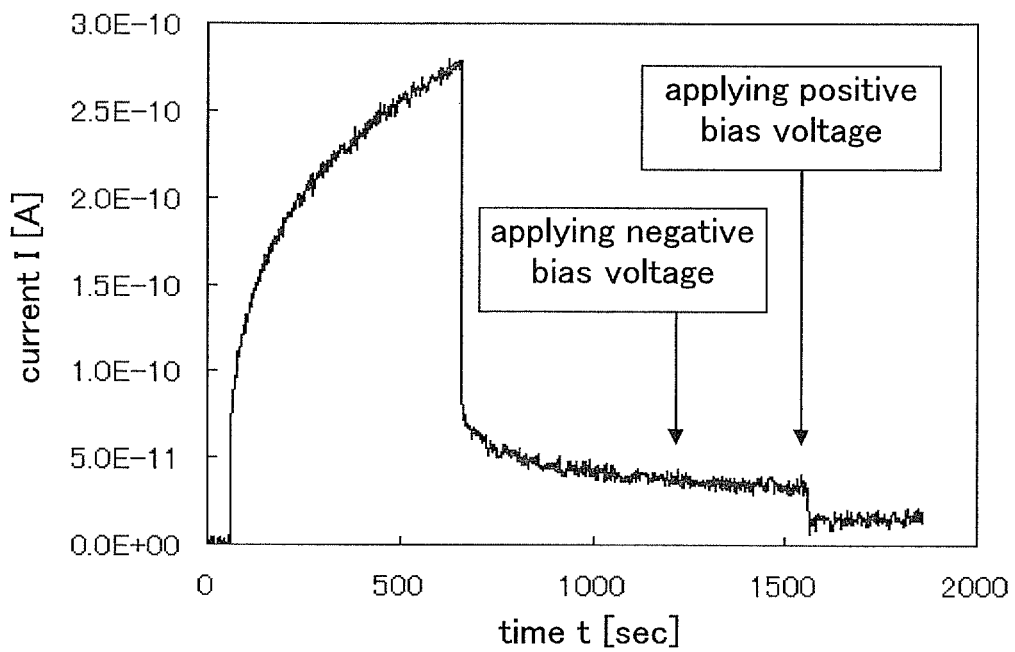
Figure 8A:
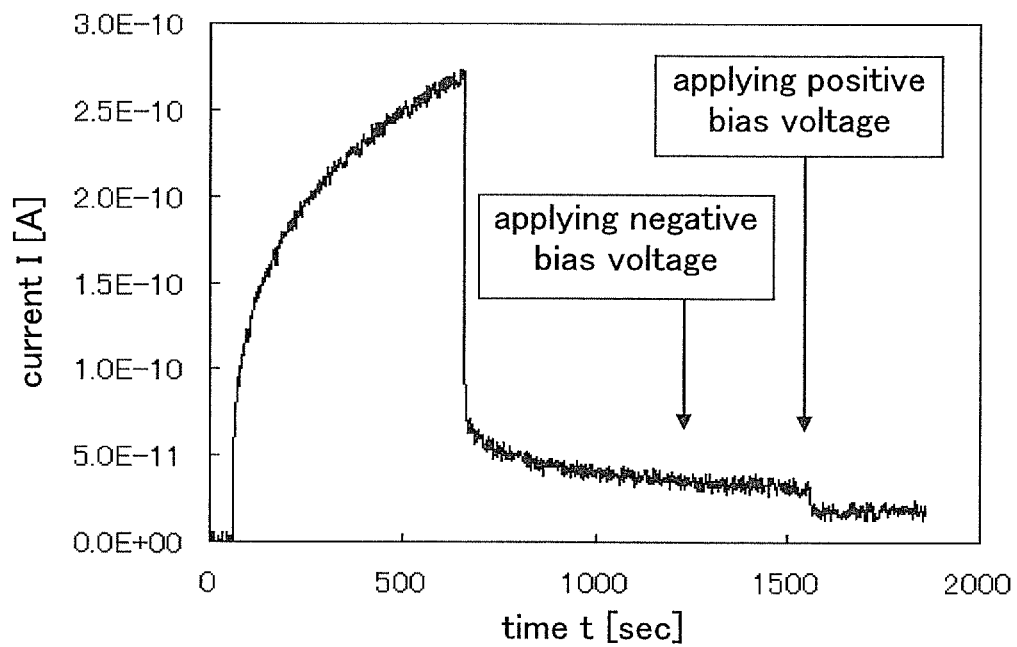
FIGS. 8A and 8B are each a graph showing photoresponse of an oxide semiconductor film.
Figure 8B:
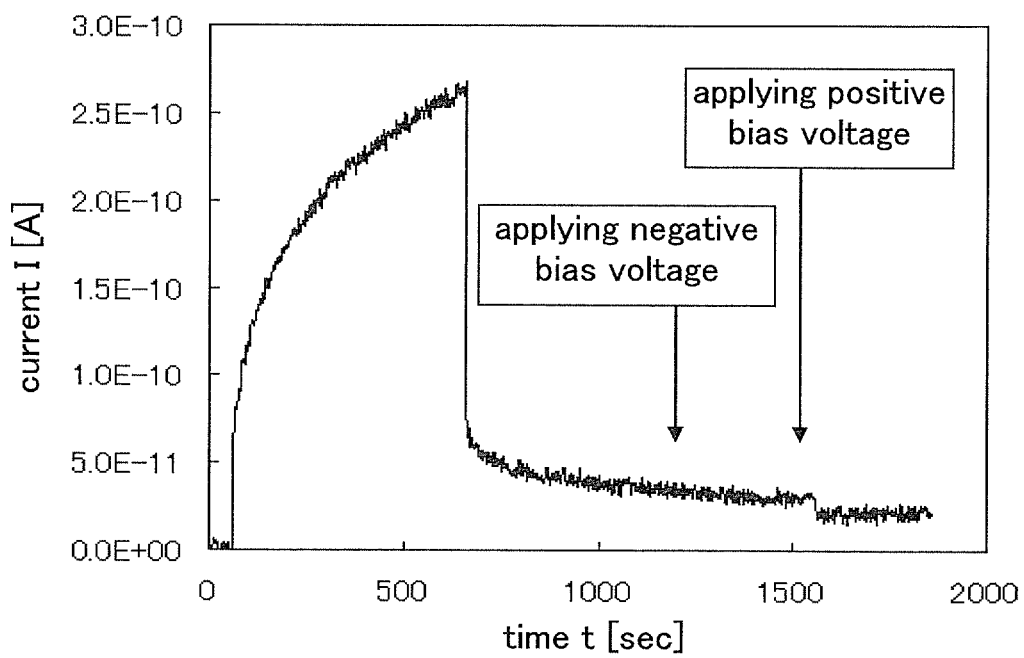

Next, irradiation of single color light having a wavelength of 400 nm was performed from the pair of electrodes 316 side for 600 sec, and then the light was blocked. The state where the light was blocked was kept for 600 sec, and then a bias voltage of −20 V was applied to the electrode 304. After that, the state where the light was blocked was kept for 300 sec, and then a bias voltage of 20 V was applied to the electrode 304. FIGS. 5A and 5B, FIGS. 6A and 6B, FIGS. 7A and 7B, and FIGS. 8A and 8B each show a relation between time and the value of current which flows between the pair of electrodes 316 during the above process. FIG. 5A shows the case of applying each of the bias voltages for 1 hour, FIG. 5B shows the case of applying each of the bias voltages for 1 sec, FIG. 6A shows the case of applying each of the bias voltages for 100 msec, FIG. 6B shows the case of applying each of the bias voltages for 10 msec, FIG. 7A shows the case of applying each of the bias voltages for 1 msec, FIG. 7B shows the case of applying each of the bias voltages for 100 μsec, FIG. 8A shows the case of applying each of the bias voltages for 10 μsec, and FIG. 8B shows the case of applying each of the bias voltages for 1 μsec. Note that the current values and times during a period in which the bias voltage is being applied are omitted in the graphs for simplicity.

FIGS. 5A and 5B, FIGS. 6A and 6B, FIGS. 7A and 7B, and FIGS. 8A and 8B show that the current value is increased from $2.5 \times 10^{-10}$ A to $3.0 \times 10^{-10}$ A by the light irradiation; then after light is blocked, the current value is reduced to approximately $5.0 \times 10^{-10}$ A; after that, the current value is slowly reduced.

As shown in FIG. 5A, when the bias voltage of −20 V was applied for 1 hour, the value of the current flowing between the pair of electrodes 316 was slightly increased. Then, when the bias voltage of 20 V was applied for 1 hour, the value of the current flowing between the pair of electrodes 316 became less than or equal to $1 \times 10^{-12}$ A.

As shown in FIG. 5B, when the bias voltage of −20 V was applied for 1 sec, the value of the current flowing between the pair of electrodes 316 was slightly reduced. Then, when the bias voltage of 20 V was applied for 1 sec, the value of the current flowing between the pair of electrodes 316 became less than or equal to $1\times10^{-12}$ A.

As shown in FIG. 6A, when the bias voltage of −20 V was applied for 100 msec, the value of the current flowing between the pair of electrodes 316 was hardly changed. Then, when the bias voltage of 20 V was applied for 100 msec, the value of the current flowing between the pair of electrodes 316 became less than or equal to $1\times10^{-12}$ A.

As shown In FIG. 6B, when the bias voltage of −20 V was applied for 10 msec, the value of the current flowing between the pair of electrodes 316 was hardly changed. Then, when the bias voltage of 20 V was applied for 10 msec, the value of the current flowing between the pair of electrodes 316 became approximately $2.3\times10^{-12}$ A.

As shown in FIG. 7A, when the bias voltage of −20 V was applied for 1 msec, the value of the current flowing between the pair of electrodes 316 was hardly changed. Then, when the bias voltage of 20 V was applied for 1 msec, the value of the current flowing between the pair of electrodes 316 became approximately $7.0\times10^{-12}$ A.

As shown in FIG. 7B, when the bias voltage of −20 V was applied for 100 μsec, the value of the current flowing between the pair of electrodes 316 was hardly changed. Then, when the bias voltage of 20 V is applied for 100 μsec, the value of the current flowing between the pair of electrodes 316 became approximately $1.5\times10^{-11}$ A.

As shown in FIG. 8A, when the bias voltage of −20 V was applied for 10 μsec, the value of the current flowing between the pair of electrodes 316 was hardly changed. Then, when the bias voltage of 20 V was applied for 10 μsec, the value of the current flowing between the pair of electrodes 316 became approximately $1.8\times10^{-11}$ A.

As shown in FIG. 8B, when the bias voltage of −20 V was applied for 1 μsec, the value of the current flowing between the pair of electrodes 316 was hardly changed. Then, when the bias voltage of 20 V was applied for 1 μsec, the value of the current flowing between the pair of electrodes 316 became approximately $2.1\times10^{-11}$ A.

As described above, it can be found that the value of the current flowing between the pair of electrodes 316 is suddenly increased after the light irradiation; and then although the value is reduced to some extent after the light blocking, it takes a considerable time until the value of the current is reduced to a value almost equal to the value at the starting time of the measurement.

In addition, although the value of the current flowing between the pair of electrodes 316 is hardly reduced (changed) even when the negative bias voltage is applied to the electrode 304, the value of the current flowing between the pair of electrodes 316 is reduced to a value close to the value at the starting time of the measurement when the positive bias voltage is applied. In short, it can be found that the photoexcited carriers which are generated in the oxide semiconductor film 306 can be reduced by application of a positive bias.

This application is based on Japanese Patent Application serial No. 2011-049786 filed with Japan Patent Office on Mar. 8, 2011, the entire contents of which are hereby incorporated by reference.

What is claimed is:

1. A defect evaluation method comprising the steps of:
   applying direct-current voltage between a first electrode and a second electrode of a sample;
   repeating a first step; the first step comprising:
      irradiating the sample with light to generate photoexcited carriers in a semiconductor film of the sample, and detecting a value of current flowing between the first electrode and the second electrode; and
      blocking the light, and performing treatment to reduce the photoexcited carriers;
   changing an amount of the light so that the value of the current is within a certain range of a given value after the first step;
   repeating a second step after the changing step; the second step comprising:
      irradiating the sample with the light to generate photoexcited carriers in the semiconductor film of the sample, and detecting a value of current flowing between the first electrode and the second electrode; and
      blocking the light, and performing the treatment to reduce the photoexcited carriers; and
   recording a wavelength of the light and the amount of the light after the value of the current is within the certain range of the given value,
   wherein the sample includes the first electrode and the second electrode over a semiconductor, an insulating film below the semiconductor, and a third electrode below the insulating film.

2. The defect evaluation method according to claim 1, further comprising the steps of:
   changing the wavelength of the light after the recording.

3. The defect evaluation method according to claim 1, further comprising the steps of:
   changing the amount of the light so that the value of the current is within the certain range of the given value after the second step.

4. The defect evaluation method according to claim 1, wherein positive bias voltage is applied to the third electrode as the treatment to reduce the photoexcited carriers.

5. The defect evaluation method according to claim 4, wherein the positive bias voltage is applied for a time longer than or equal to 1 μsec and shorter than or equal to 1 sec.

6. The defect evaluation method according to claims 1, wherein the semiconductor film comprises an oxide semiconductor.

7. The defect evaluation method according to claims 1, wherein the light is emitted from a xenon lamp.

8. The defect evaluation method according to claims 1, wherein the certain range of the given value is a range of ±10% of the given value.

9. A measurement apparatus comprising:
   a first terminal;
   a second terminal;
   a third terminal;
   a lamp;
   a spectroscope;
   a filter;
   a beam splitter configured to transmit and reflect light emitted from the lamp through the spectroscope and the filter;
   a photodiode configured to convert the light entered from the beam splitter into current;
   a calculator configured to estimate an amount of the light using a value of the current;
   a direct-current power source electrically connected to the first terminal, the second terminal, and a resistor; and
   a power source electrically connected to the third terminal,
   wherein the calculator is configured to feed back a photocurrent value flowing through the resistor to the filter.

10. The measurement apparatus according to claim 9, further comprising:
   a first lock-in amplifier electrically connected to the photodiode and the calculator; and a second lock-in amplifier electrically connected to the resistor and the calculator, wherein the first lock-in amplifier is configured to measure the value of the current, and wherein the second lock-in amplifier is configured to measure the photocurrent value.

11. The measurement apparatus according to claim 9, wherein the power source is configured to apply positive bias voltage.

12. The measurement apparatus according to claim 11, wherein the power source is configured to apply the positive bias voltage for a time longer than or equal to 1 μsec and shorter than or equal to 1 sec.

13. The measurement apparatus according to claims 9, wherein the lamp is a xenon lamp.

* * * * *